United States Patent [19]

De Mello Borges et al.

[11] Patent Number: 5,759,623
[45] Date of Patent: Jun. 2, 1998

[54] METHOD FOR PRODUCING A HIGH ADHESION THIN FILM OF DIAMOND ON A FE-BASED SUBSTRATE

[75] Inventors: Carlos Fernando De Mello Borges, Montréal; Michel Moisan, Outremont; Francois Roy, Ste-Julienne, all of Canada

[73] Assignee: Universite de Montreal, Montreal, Canada

[21] Appl. No.: 527,900

[22] Filed: Sep. 14, 1995

[51] Int. Cl.⁶ .............................. C23C 16/26; B05D 3/00
[52] U.S. Cl. .................. 427/249; 427/535; 427/560; 427/318; 427/327
[58] Field of Search .................. 427/577, 534, 427/535, 560, 249, 318, 327; 423/446

[56] References Cited

U.S. PATENT DOCUMENTS

| | | | |
|---|---|---|---|
| 4,233,086 | 11/1980 | Vesterlund | 148/6.3 |
| 4,345,019 | 8/1982 | Kohmura | 430/234 |
| 4,413,022 | 11/1983 | Suntola et al. | 427/255.2 |
| 4,610,699 | 9/1986 | Yazu et al. | 51/309 |
| 4,844,785 | 7/1989 | Kitabatake et al. | 204/192.11 |
| 4,913,882 | 4/1990 | May et al. | 422/58 |
| 4,997,636 | 3/1991 | Prins | 423/446 |
| 5,028,451 | 7/1991 | Ito et al. | 427/39 |
| 5,075,094 | 12/1991 | Morrish et al. | 423/446 |
| 5,100,703 | 3/1992 | Saijo et al. | 427/249 |
| 5,103,285 | 4/1992 | Furumura et al. | 357/68 |
| 5,106,452 | 4/1992 | Kadono et al. | 156/613 |
| 5,130,111 | 7/1992 | Pryor | 423/446 |
| 5,139,372 | 8/1992 | Tanabe et al. | 407/118 |
| 5,154,550 | 10/1992 | Isobe et al. | 408/144 |
| 5,164,051 | 11/1992 | Komaki et al. | 204/129.43 |
| 5,173,089 | 12/1992 | Tanabe et al. | 51/293 |
| 5,183,685 | 2/1993 | Yamazaki | 427/571 |
| 5,190,796 | 3/1993 | Iacovangelo | 427/304 |
| 5,190,823 | 3/1993 | Anthony et al. | 428/408 |
| 5,197,654 | 3/1993 | Katz et al. | 228/124 |
| 5,204,167 | 4/1993 | Saijo et al. | 428/212 |
| 5,217,700 | 6/1993 | Kurihara et al. | 423/446 |
| 5,221,411 | 6/1993 | Narayan | 156/603 |
| 5,236,740 | 8/1993 | Peters et al. | 427/249 |
| 5,258,206 | 11/1993 | Hayashi et al. | 427/577 |
| 5,270,029 | 12/1993 | Yamasaki | 423/449.1 |
| 5,271,696 | 12/1993 | Stöck | 408/144 |
| 5,275,693 | 1/1994 | Nakama | 156/644 |
| 5,298,286 | 3/1994 | Yang et al. | 427/249 |
| 5,308,367 | 5/1994 | Julien | 51/293 |
| 5,314,726 | 5/1994 | Kurihara et al. | 427/577 |
| 5,334,453 | 8/1994 | Iio et al. | 428/408 |
| 5,337,844 | 8/1994 | Tibbitts | 175/434 |
| 5,338,364 | 8/1994 | Kurihara et al. | 118/729 |
| 5,344,551 | 9/1994 | Tsai et al. | 205/110 |
| 5,346,719 | 9/1994 | Zarnoch et al. | 427/97 |
| 5,349,265 | 9/1994 | Lemelson | 313/345 |
| 5,349,922 | 9/1994 | Anthony et al. | 117/204 |
| 5,360,227 | 11/1994 | Lemelson | 280/608 |
| 5,364,423 | 11/1994 | Bigelow et al. | 51/293 |
| 5,366,522 | 11/1994 | Nakamura et al. | 51/293 |
| 5,366,579 | 11/1994 | Yamazaki et al. | 156/247 |
| 5,368,897 | 11/1994 | Kurihara et al. | 427/450 |
| 5,370,944 | 12/1994 | Omori et al. | 428/565 |
| 5,371,378 | 12/1994 | Das | 257/77 |

OTHER PUBLICATIONS

Diamond Nucleation and Growth on Reactive Transition–Metal Substrates, W. Zhu, P.C. Yang J.T. Glass, and F. Arezzo, Dept. of Materials & Science Engineering, North Carolina University, Raleigh, North Carolina 27695–7919, pp. 1455–1460, Jun. 6, 1995.

"Matériaux industriels" M. Barrière, 2è Édition 1954, pp. 94–95.

"Properties of diamond composite filmss grown on iron surfaces" Ong et al. Appl. Phys. Lett. 58 (4), Jan. 28, 1991, pp. 358–360.

"An investigation of diamond growth on ferrous metals" Chen et al., Elsevier Science Publishers B.V. 1991, pp. 137–142.

"Rapid growth of continuous diamond films deposited on stainless steel" Borges et al. Groupe de physique des plasmas, U. de Montréal, Sep. 16, 1994, pp. 1–5.

"A novel technique for diamond film deposition using surface wave discharges" Borges et al. Groupe de physique des plasmas, U. de Montreal, Sep. 6, 1994.

*Primary Examiner*—Roy V. King
*Attorney, Agent, or Firm*—Griffin, Butler Whisenhunt & Kurtossy

[57] ABSTRACT

A method for depositing a thin film of diamond on the surface of a Fe-based substrate comprises the step of pre-treating the surface of the Fe-based substrate prior to the deposition consisting of nucleating carbon atoms on the Fe-based substrate to grow the thin film of diamond. The pre-treatment consists of supersaturating the surface of the Fe-based substrate with carbon atoms and heating it to form a diffusion barrier layer. During the pre-treatment, at least a portion of the carbon atoms are diffused into the Fe-based substrate. During the deposition process, carbon atoms are prevented by the diffusion barrier layer previously formed to diffuse into the Fe-based substrate whereby these carbon atoms remain available for the nucleation and growth of the thin film of diamond. A portion of the carbon atoms diffused into the Fe-based substrate during the pre-treatment are nucleated during the deposition process and act as anchors to provide a high adhesion between the thin film of diamond and the surface of the Fe-based substrate.

18 Claims, 2 Drawing Sheets

METHOD FOR PRODUCING A HIGH ADHESION THIN FILM OF DIAMOND ON A FE-BASED SUBSTRATE

BACKGROUND OF THE INVENTION

1. Field of the invention

The present invention relates to a method of producing a thin film of diamond on a metallic substrate. More specifically, the present invention relates to a method for producing a thin film of diamond having a high adhesion onto Fe-based substrates including steel-based substrates in general.

2. Brief Description of the Prior Art

Fabrication of synthetic diamond using high pressures (about 100,000 times higher than the atmospheric pressure) and high temperatures (from 2500° C. to 3000° C.) is well known in the art.

Chemical vapour deposition (CVD) constitutes another method for producing thin films, some μm thick, of synthetic diamond. Most often, CVD is accomplished at pressures lower than the atmospheric pressure and at temperatures generally lower than 1000° C., and involves an electric discharge within a gaseous mixture including $H_2$ (99% or more) and a carburized molecule such as $CH_4$. The most current type of electric discharge seems to be that obtained with microwave fields at 2.45 GHz. CVD is well known to those of ordinary skill in the art and, accordingly, will not be further described in the present disclosure.

Diamond is a crystalline structure of carbon atoms interconnected through chemical bonds of the $sp^3$ type. It presents very interesting properties such as a very great hardness, chemical inertness, a very high thermal conductivity (well higher than that of copper) and a very high resistivity. The use of thin films of synthetic diamond as coating material is therefore very promising. Thin films of synthetic diamond are also of great interest in the field of microelectronics to form, for example, electrically insulating films, heat sinks and transparent membranes for X-ray lithography used in the fabrication of micro-circuits.

In the tool industry, CVD techniques have been used to coat metallic materials such as cemented carbides, SiAlON, silicon carbide (SiC) and tungsten cutting tips with thin films of synthetic diamond. Since the hardness and resistance to wear of the thin film of synthetic diamond are higher than those of the metallic substrate, the coated tools are more efficient and have an extended lifetime.

However, the growth of CVD diamond films on a Fe-based substrate, for example a substrate made of steel or stainless steel, with no preparation other than cleaning results in the formation of a soft layer of a black powder (so-called black carbon) on the surface of the substrate during the first few minutes of exposure to the plasma; during this time, considerable diffusion of carbon into the Fe-based substrate is enabled. This leads to poor quality films and poor adhesion of the diamond films to the Fe-based substrate. More specifically, there are at least three major obstacles to successful deposition of diamond films on a Fe-based substrate:

(i) At high temperatures, carbon diffuses into the Fe-based substrate at a relatively high rate, thereby reducing the nucleation site density, increasing the nucleation time, and potentially causing changes in the mechanical properties of the Fe-based substrate since it has been carburized by the prolonged nucleation time. As the diffusion rate of the carbon atoms in the Fe-based substrate increases with temperature, heating of the Fe-based substrate to a temperature of some hundred of degrees °C. during the diamond thin film deposition (as required by the migration of adsorbed carbon atoms at the substrate surface) also enables the carbon atoms to diffuse deep in the Fe-based substrate, thereby reducing the number of carbon atoms available for the nucleation and subsequent growth of diamond films. Therefore, a concentration of iron (Fe) at the surface of the substrate is detrimental to diamond growth; according to some authors, diamond nucleates only once the concentration of iron has fallen below a certain critical threshold;

(ii) Iron produces a catalytic effect whereby a black deposit, the so-called black carbon, forms on the surface of the Fe-based substrate when exposed to conditions for diamond film deposition; and (iii) The thermal expansion coefficients of diamond and ferrous metals are not compatible and this mismatch usually causes poor adhesion and high residual stress between the diamond film and the Fe-based substrate.

Similarly to Fe, the presence of Ni and Cr atoms is also detrimental to diamond nucleation on steel-based substrates.

To overcome the above described obstacles, prior art techniques have used transition interfaces between the Fe-based substrate to be coated and the diamond thin film coating. For example, a thin intermediate film of TiN, TiC, SiC or diamond-like carbon (DLC) is first applied to the surface of the Fe-based substrate and the thin film of synthetic diamond grows onto this intermediate film. DLC is an amorphous phase of the carbon atoms in which the carbon atoms are interconnected through bonds of the types $sp^2$ and $sp^3$ in substantially equal number.

OBJECTS OF THE INVENTION

An object of the present invention is therefore to provide a method for depositing a thin film of synthetic diamond directly, i.e. with no transition interface, on the surface of a Fe-based substrate.

Another object of the present invention is to provide a deposition method comprising a pre-treatment for supersaturating the surface of the Fe-based substrate with carbon atoms in view of producing a diffusion barrier layer and thereby enabling direct deposition of a thin film of synthetic diamond on the surface of the Fe-based substrate.

A further object of the present invention is to provide a deposition method in which the nucleation time is reduced, the formation of black carbon during diamond nucleation is eliminated and the adhesion of the diamond film to the surface of the substrate is increased.

SUMMARY OF THE INVENTION

More specifically, in accordance with the present invention, there is provided a method for depositing a thin film of diamond on a surface of a Fe-based substrate, comprising the steps of:

pre-treating the surface of the Fe-based substrate to produce a concentration of carbon atoms and thereby form a diffusion barrier layer; and depositing a thin film of diamond on the pre-treated surface, this depositing step comprising nucleating carbon atoms on the Fe-based substrate to grow the thin film of diamond.

The diffusion barrier layer prevents the carbon atoms participating in the deposition process to diffuse into the Fe-based substrate whereby these carbon atoms remain available for nucleation and growth of the thin film of diamond.

Advantageously, the pre-treating step comprises diffusing at least a portion of the carbon atoms forming the diffusion barrier layer into the Fe-based substrate, and the depositing step comprises nucleating carbon atoms of the diffusion barrier layer diffused into the Fe-based substrate to contribute to the growth of the thin film of diamond. Therefore, the nucleated, diffused carbon atoms act as anchors to provide a high adhesion between the thin film of diamond and the Fe-based substrate.

Preferably, the pre-treating step comprises supersaturating the surface of the Fe-based substrate with carbon atoms and heating this surface to form the diffusion barrier layer.

In accordance with a first preferred embodiment of the method according to the invention, the pre-treating step comprises the steps of:

(a) producing a plasma discharge containing a carbon atom donor gaseous substance such as methane;

(b) exposing the surface of the Fe-based substrate to the plasma discharge and heating this surface during a given period of time to produce the diffusion barrier layer, this step (b) producing a black carbon deposit on the surface of the Fe-based substrate;

(c) removing the black carbon deposit from the surface of the Fe-based substrate; and (d) submitting the surface of the Fe-based substrate to an ultrasonic treatment with diamond powder in a methanol solution for a predetermined period of time.

In accordance with a second preferred embodiment of the method according to the invention, the pre-treating step comprises the steps of:

(a) placing a carbon atom donor substance in contact with the surface of the Fe-based substrate;

(b) heating the Fe-based substrate along with the carbon atom donor substance to a predetermined temperature for a given period of time to transfer carbon atoms from the carbon atom donor substance to the surface of the Fe-based substrate, the heating step (b) producing a black carbon deposit on the surface of the Fe-based substrate;

(c) removing the black carbon deposit produced on the surface of the Fe-based substrate; and (d) submitting the surface of the Fe-based substrate to an ultrasonic treatment with diamond powder in a methanol solution for a predetermined period of time.

The carbon atom donor substance and the Fe-based substrate may be placed into a sealed container prior to the heating step (b).

Also, the heating step (b) may comprise heating the Fe-based substrate and the carbon atom donor substance at a temperature of about 500° C. for a period of about 8 hours.

In accordance with a third preferred embodiment of the method according to the invention, the pre-treating step comprises the steps of:

(a) heating the surface of the Fe-based substrate, for example with an oxy-acetylene torch;

(b) exposing the surface of the Fe-based substrate to a flow of a carbon atom donor gaseous substance such as acetylene, to transfer carbon atoms from this gaseous substance to the heated surface of the Fe-based substrate, the exposing step (b) producing a black carbon deposit on the surface of the Fe-based substrate;

(c) removing the black carbon deposit produced on the surface of the Fe-based substrate; and (d) submitting the surface of the Fe-based substrate to an ultrasonic treatment with diamond powder in a methanol solution for a predetermined period of time.

The above series of steps (a), (b) and (c) may be repeated, and step (a) may comprise heating the surface of the Fe-based substrate to a temperature of about 800° C.

The depositing step may comprise the steps of:

producing a microwave discharge containing a carbon atom donor gaseous substance such as a mixture of hydrogen and methane; and exposing the pre-treated surface to this microwave discharge to nucleate carbon atoms on the Fe-based substrate and grow the thin film of diamond.

The present invention further relates to a thin film of diamond produced on a surface of a Fe-based substrate in accordance with the above described method.

Finally, the invention is concerned with a combination of a thin film of diamond and a Fe-based substrate comprising the thin film of diamond deposited on a surface of the Fe-based material and consisting of a structure of polycrystalline carbon atoms in the diamond phase, a portion of these polycrystalline carbon atoms being diffused into the Fe-based material and acting as anchors to provide a high adhesion between the thin film of diamond and the Fe-based substrate.

The objects, advantages and other features of the present invention will become more apparent upon reading of the following non restrictive description of preferred embodiments thereof, given by way of example only with reference to the accompanying drawings.

DETAILED DESCRIPTION OF THE PREFERRED EMBODIMENTS

Figure 1:
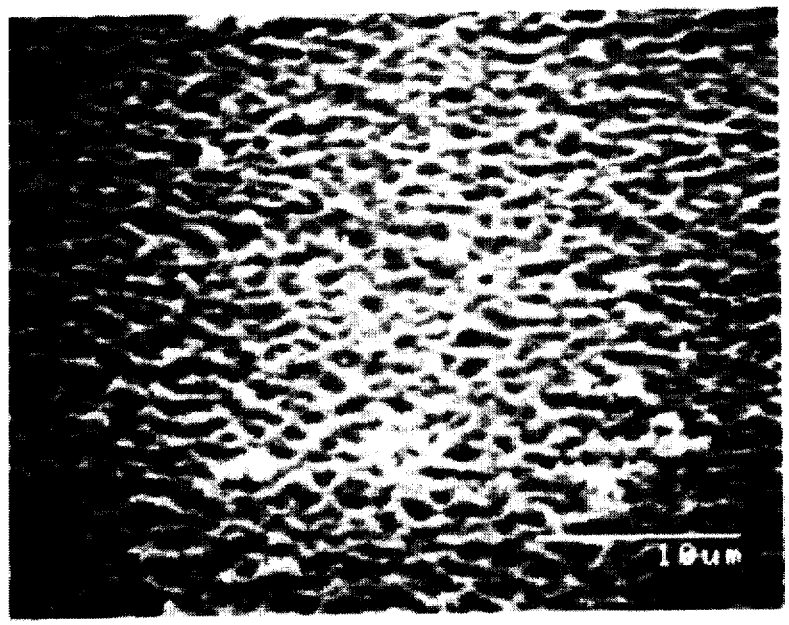
FIG. 1 is a scanning electron microscopy (SEM) image showing the morphology of a thin film of diamond deposited on a Fe-based substrate surface having been pre-treated with an oxy-acetylene torch to form thereon a diffusion barrier layer.

The present invention is therefore concerned with a method of producing a high adhesion film of diamond on a Fe-based substrate. This method is characterized by a pre-treatment of the surface of the Fe-based substrate for creating on this surface a diffusion barrier on which the diamond film initially grows.

The diffusion barrier layer may be described as resulting from a supersaturation of the surface of the Fe-based substrate with carbon atoms, this process being enhanced when the surface is heated.

Achieving a diffusion barrier on the surface of the Fe-based substrate on which the thin film of diamond will grow prevents the carbon atoms arriving on this surface and participating in the CVD deposition process to diffuse into the Fe-based material whereby these carbon atoms remain available for nucleation and growth of the thin film of diamond. The nucleation of the carbon atoms and therefore the growth of the thin film of diamond are faster since the diffusion barrier has reduced the concentration of iron (Fe) atoms at the surface of the substrate, thus avoiding the removal of carbon atoms from the diamond growth process. Indeed, carbon atoms have a tendency to attach to Fe, Ni and Cr atoms present in steel materials to form various compounds.

The catalytic effect of iron is prevented. Indeed, formation of black carbon on the surface of the Fe-based substrate is reduced since the concentration of elemental iron atoms available to form carbide compounds at the substrate's surface has been decreased by the formation of the diffusion barrier layer.

Since at least a portion of the carbon atoms of the diffusion barrier layer nucleate when exposed to CVD conditions to contribute to the growth of the polycrystalline diamond film, and since at least a portion of the carbon atoms forming the diffusion barrier have penetrated or diffused into the Fe-based substrate, adhesion between the thin film of diamond and the Fe-based substrate is high. More specifically, carbon atoms of the diffusion barrier layer having penetrated or diffused in the Fe-based substrate during the pre-treatment nucleate to contribute to the growth of the thin film of diamond, to act as anchors and provide a high adhesion between the thin film of diamond and the surface of the Fe-based substrate.

Many methods are available for pre-treating the surface of the Fe-based substrate to form the diffusion barrier layer. Three of these methods have been experimented as described in the following three examples.

EXAMPLE #1

In this first example, a thin film of diamond has been deposited onto the surface of a piece of 304 stainless steel by means of CVD deposition.

Prior to the CVD deposition, the surface of 304 stainless steel has been pre-treated to form a diffusion barrier layer onto that 304 stainless steel surface. The pre-treatment consists of supersaturating the surface of the 304 stainless steel substrate with carbon and heating this surface to form the diffusion barrier layer. According to the first example, the pre-treatment has involved the following sequential steps:
Step 1: Heating the surface of the 304 stainless steel substrate to a temperature of about 800° C., using an oxy-acetylene torch;
Step 2: Then, the oxygen supply of the torch is interrupted to expose the surface of the 304 stainless steel substrate to a flow of acetylene ($C_2H_2$) to transfer carbon atoms from the acetylene to the heated surface, at least a portion of these carbon atoms penetrating the stainless steel material. A black carbon deposit develops and covers the surface of stainless steel;
Step 3: Removing the layer of black carbon with a rag, and polishing the substrate's surface using steel wool;
Step 4: This step is optional and consists of repeating steps 1, 2 and 3 many times; and
Step 5: Step 5 consists of submitting the 304 stainless steel substrate to an ultrasonic bath with diamond powder in a methanol solution during approximately 60 minutes. The dimension of the particles forming the diamond powder is of the order of the μm.

The substrate is then placed into a plasma reactor and deposition of a thin film of diamond using a conventional CVD technique was carried out. In the reactor, a microwave discharge containing a carbon atom donor gaseous substance such as methane, and hydrogen was produced. The pre-treated surface was exposed to the microwave discharge to nucleate carbon atoms on the substrate to grow the thin film of diamond. The conditions were: gas mixture of 0.5% methane ($CH_4$) in hydrogen ($H_2$); flow rate of 100 sccm; pressure of 15 torr; substrate temperature of 800° C.; and deposition time of 3 hours.

CVD is believed to be otherwise well known to those of ordinary skill in the art and accordingly will not be further described in the present disclosure.

Scanning electron microscopy (SEM) has been used to examine the morphology of the diamond films. FIG. 1 shows the SEM image of the thin diamond film deposited after 3 hours. The average particle size of the polycrystalline diamond film is smaller than approximately 1.0 μm; a continuous diamond film with sub-micron sized grains was formed as shown in the photograph.

Figure 2:
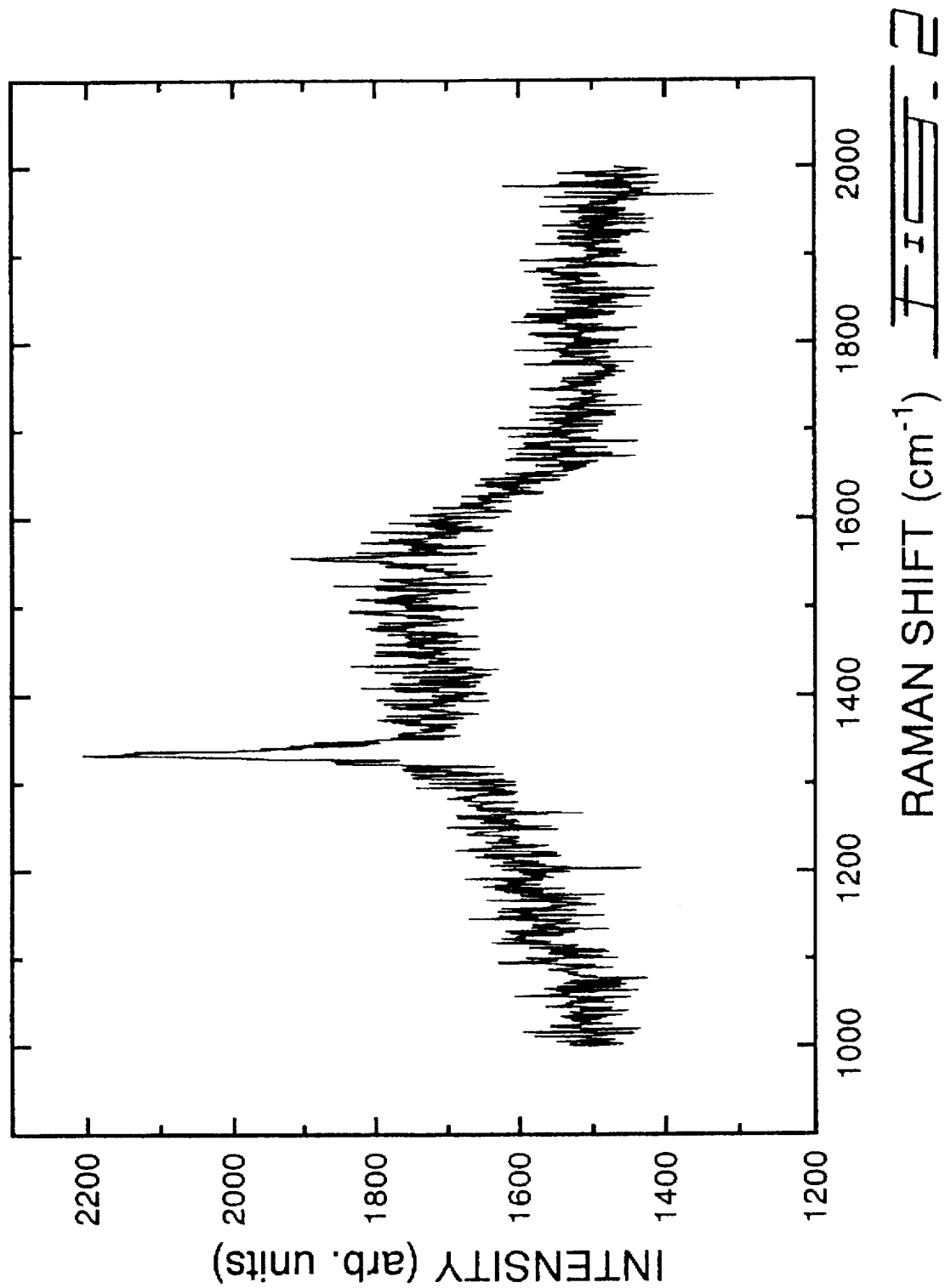
FIG. 2 is a graph obtained from Raman spectroscopy using a 488 nm $Ar^+$ ion laser excitation and performed on a thin film of polycrystalline diamond deposited on a Fe-based substrate surface having been pre-treated with an oxy-acetylene torch to form thereon a diffusion barrier layer, in which the broad peak at 1332 $cm^{-1}$ stands for diamond and the small peak at about 1580 $cm^{-1}$ is associated with a small content of non-diamond phases such as amorphous carbon and graphite.

Raman spectroscopy with a 488 nm $Ar^+$ ion laser excitation was also performed as shown in FIG. 2 of the appended drawings. The broad peak at 1332 $cm^{-1}$ stands for diamond and the small peak at about 1580 $cm^{-1}$ is associated with a small content of non-diamond phases such as amorphous carbon and graphite. It is not clear whether it is due to iron diffusing through the deposited layer or to formation of a complicated mixture of $Fe_3C$ and graphite. The equilibrium phase diagram for Fe/C shows the possibility of the formation of the mixture of $Fe_3C$ and graphite at 900° C. with high carbon concentrations ($\geq 25\%$).

A drawback of the method of Example #1 is that it is difficult to carry out a uniform pre-treatment of surfaces larger than some square centimeters since the nozzle of an oxy-acetylene torch is limited in size.

EXAMPLE #2

To carry out a uniform pre-treatment over a relatively large surface of Fe-based substrate, a second pre-treatment method has been developed. This second pre-treatment method comprises the following sequential steps:
Step 1: Covering the surface to be pre-treated with a carbon atom donor substance, for example by burying the Fe-based substrate in a black carbon or charcoal powder contained into an impervious container;
Step 2: This step is optional and consists of sealing the container;
Step 3: Heating the assembly container-powder-substrate to about 500° C. for about 8 hours. During this step, carbon atoms from the powder material are transferred to the surface of the Fe-based substrate to produce a concentration of carbon atoms and thereby form thereon a diffusion barrier layer. A black carbon deposit develops and covers the substrate's surface;
Step 4: Removing the black carbon deposit with a rag, and polishing the substrate's surface using steel wool; and
Step 5: Step 5 consists of submitting the Fe-based substrate to an ultrasonic bath with diamond powder in a methanol solution during approximately 60 minutes. The dimension of the particles forming the diamond powder is of the order of the μm.

The substrate is then placed into a plasma reactor and deposition of a thin film of diamond using a conventional CVD technique is carried out.

This method not only makes it possible to perform a uniform pre-treatment of large surfaces of Fe-based substrate but also enables accurate control of the temperature at which the substrate is heated during the pre-treatment, while with the oxy-acetylene torch no sensing and control of that temperature is readily possible, the only indication then being the change to red of the colour of the Fe-based material.

This method is also capable of pre-treating surfaces at lower temperatures. This will enable pre-treatment at lower temperatures of materials of which the structure would be modified upon heating at temperature as high as the steel pre-treatment temperature.

EXAMPLE #3

A third method for pre-treating the surface of the Fe-based substrate has been experimented. This third method comprises the following steps:

Step 1: Producing a plasma discharge containing only a first carbon atom donor gaseous substance such as methane.

Step 2: Exposing the surface of the Fe-based substrate to the plasma discharge and heating it during a relatively short predetermined period of time. The methane contained in the plasma discharge forms the diffusion barrier layer by supersaturating the surface of the Fe-based substrate with carbon atoms. A black carbon deposit develops and covers the substrate's surface;

Step 3: Removing the black carbon deposit with a rag, and polishing the substrate's surface using steel wool; and Step 5: Step 5 consists of submitting the Fe-based substrate to an ultrasonic treatment, i.e. an ultrasonic bath with diamond powder in a methanol solution during approximately 60 minutes. The dimension of the particles forming the diamond powder is of the order of the μm.

The substrate is then placed into a plasma reactor and deposition of a thin film of diamond using a conventional CVD technique is carried out.

A first advantage of the third method is the shorter period of time required for pre-treating the surface of the Fe-based substrate. Another advantage of this third method is that the surface pre-treatment and the diamond deposition can be integrated in a single system, the plasma reactor; after the diffusion barrier layer has been formed, the diamond deposition can be conducted by simply replacing the supply gas of the plasma torch by a carbon atom donor gaseous substance such as a mixture of hydrogen $H_2$ (at a concentration of $\geq 99\%$) and methane $CH_4$.

Figure 3:
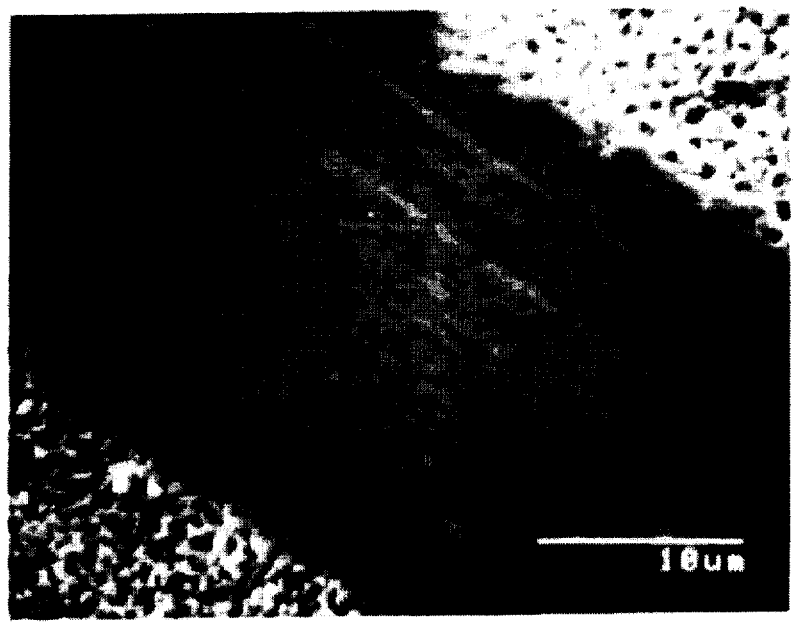
FIG. 3 is an example of scratch made by a scratch tester onto a thin film of diamond deposited in accordance with method of the present invention.

To determine the strength of the adhesion of the thin film of diamond to the surface of the substrate, a scratch tester has been used. A scratch tester comprises a point of diamond having a tip of known radius (200 μm) and a calibrated weight. The diamond point was moved on the thin film of diamond at a constant speed of 5 mm/min and a force perpendicular to the surface of the diamond thin film was gradually increased to determine the moment at which scratching or breaking of the thin film of diamond occurs. It has been found that a pressure of about 120 N/mm$^2$ could be applied before damaging the diamond thin film. An example of scratch without damaging the diamond thin film is shown in FIG. 3.

In conclusion, the diffusion barrier layer in accordance with the present invention reduces carbon diffusion into the substrate, blocks the iron catalytic effect and improves the diamond film adhesion whereby growth of well-adhered diamond films on Fe-base substrates is enabled.

Although the present invention has been described hereinabove by way of preferred embodiments thereof, these embodiments can be modified at will, within the scope of the appended claims, without departing from the spirit and nature of the subject invention.

What is claimed is:

1. A method for depositing a thin film of diamond on a surface of a Fe-based substrate, comprising the steps of:

pre-treating the surface of the Fe-based substrate to produce a concentration of carbon atoms and thereby form a diffusion barrier layer, said pre-treating step comprising the following steps:

a) heating the surface of the Fe-based substrate;

b) exposing the heated surface of the Fe-based substrate to a carbon atom donor substance to produce the concentration of carbon atoms and thereby form the diffusion barrier, said step (b)producing a black carbon deposit on the surface of the Fe-based substrate; and, c) removing the black carbon deposit from the surface of the Fe-based substrate; and depositing the thin film of diamond on the pre-treated surface, said depositing step comprising nucleating carbon atoms on the Fe-based substrate to grow the thin film of diamond;

wherein the diffusion barrier layer prevents the carbon atoms participating in the deposition process to diffuse into the Fe-based substrate whereby said carbon atoms remain available for nucleation and growth of the thin film of diamond.

2. A method as recited in claim 1, wherein:

the pre-treating step comprises diffusing carbon atoms from the carbon atom donor substance into the Fe-based substrate to form the diffusion barrier layer; and said depositing step comprises nucleating carbon atoms diffused into the Fe-based substrate to contribute to the growth of the thin film of diamond, wherein the nucleated, diffused carbon atoms act as anchors to improve adhesion between the thin film of diamond and the Fe-based substrate.

3. A method as recited in claim 1, in which the pre-treating step comprises supersaturating the surface of the Fe-based substrate with carbon atoms.

4. A method as recited in claim 1, wherein the depositing step comprises the steps of:

producing a microwave discharge containing a carbon atom donor gaseous substance; and exposing the pre-treated surface to said microwave discharge to nucleate carbon atoms on the Fe-based substrate and grow the thin film of diamond.

5. A method as recited in claim 4, in which the carbon atom donor gaseous substance comprises a mixture of hydrogen and methane.

6. A method for depositing a thin film of diamond on a surface of a Fe-based substrate, comprising the steps of:

pre-treating the surface of the Fe-based substrate to produce a concentration of carbon atoms and thereby form a diffusion barrier layer, said pre-treating step comprising the following steps:

(a) producing a plasma discharge containing a carbon atom donor gaseous substance;

(b) exposing the surface of the Fe-based substrate to the plasma discharge and heating said surface of the Fe-based substrate during a given period of time to produce the concentration of carbon atoms and thereby form the diffusion barrier layer, said step (b) producing a black carbon deposit on the surface of the Fe-based substrate; and (c) removing the black carbon deposit from the surface of the Fe-based substrate; and depositing the thin film of diamond on the pre-treated surface, said depositing step comprising nucleating carbon atoms on the Fe-based substrate to grow the thin film of diamond;

wherein the diffusion barrier layer prevents the carbon atoms participating in the deposition process to diffuse into the Fe-based substrate whereby said carbon atoms remain available for nucleation and growth of the thin film of diamond.

7. A method as recited in claim 6, wherein the carbon atom donor gaseous substance comprises methane.

8. A method as recited in claim 6, wherein the pre-treating step further comprises:

(d) submitting the surface of the Fe-based substrate to an ultrasonic treatment with diamond powder in a methanol solution for a predetermined period of time.

9. A method for depositing a thin film of diamond on the surface of a Fe-based substrate, comprising the steps of:

pre-treating the surface of the Fe-based substrate to produce a concentration of carbon atoms and thereby form a diffusion barrier layer, said pre-treating step comprising the following steps:

(a) placing a carbon atom donor substrate in contact with the surface of the Fe-based substrate;

(b) heating the F-based substrate along with the carbon atom donor substance to a predetermined temperature for a given period of time to transfer carbon atoms from the carbon atom donor substance to the surface of the Fe-based substrate to produce the concentration of carbon atoms and thereby form the diffusion barrier layer, said heating step (b) producing a black carbon deposit on the surface of the Fe-based substrate; and (c) removing the black carbon deposit from the surface of the Fe-based substrate; and depositing the thin film of diamond on the pre-treated surface, said depositing step comprising nucleating carbon atoms on the Fe-based substrate to grow the thin film of diamond;

wherein the diffusion barrier layer prevents the carbon atoms participating in the deposition process to diffuse into the Fe-based substrate whereby said carbon atoms remain available for nucleation and growth of the thin film of diamond.

10. A method as recited in claim 9, comprising the step of placing the carbon atom donor substance and the Fe-based substrate into a sealed container prior to the heating step (b).

11. A method as recited in claim 9, wherein the heating step (b) comprising heating the Fe-based substrate and the carbon atom donor substance at a temperature of about 500° C. for a period of about 8 hours.

12. A method as recited in claim 9, wherein the pre-treating step further comprises the step of:

(d) submitting the surface of the Fe-based substrate to an ultrasonic treatment with diamond powder in a methanol solution for a predetermined period of time.

13. A method for depositing a thin film of diamond on a surface of a Fe-based substrate, comprising the steps of:

pre-treating the surface of the Fe-based substrate to produce a concentration of carbon atoms and thereby form a diffusion barrier layer, said pre-treating step comprising the following steps:

(a) heating the surface of the Fe-based substrate;

(b) exposing the surface of the Fe-based substrate to a flow of a carbon atom donor gaseous substance to transfer carbon atoms from said gaseous substance to the heated surface of the Fe-based substrate so as to produce the concentration of carbon atoms and thereby form the diffusion barrier layer, said exposing step (b) producing a black carbon deposit on the surface of the Fe-based substrate; and (c) removing the black carbon deposit from the surface of the Fe-based substrate; and depositing the thin film of diamond on the pre-treated surface, said depositing step comprising nucleating carbon atoms on the Fe-based substrate to grow the thin film of diamond;

wherein the diffusion barrier layer prevents the carbon atoms participating in the deposition process to diffuse into the Fe-based substrate whereby said carbon atoms remain available for nucleation and growth of the thin film of diamond.

14. A method as recited in claim 13, wherein the pre-treating step further comprises the step of:

(d) submitting the surface of the Fe-based substrate to an ultrasonic treatment with diamond powder in a methanol solution for a predetermined period of time.

15. A method as recited in claim 13, comprising the step of repeating the series of steps (a), (b) and (c).

16. A method as recited in claim 13, wherein said step (a) comprises heating the surface of the Fe-based substrate to a temperature of about 800° C.

17. A method as recited in claim 13, wherein the carbon atom donor gaseous substance comprises acetylene.

18. A method as recited in claim 17, wherein said step (a) comprises heating the surface of the Fe-based substrate with an oxy-acetylene torch.

* * * * *